(12) United States Patent
Tseng et al.

(10) Patent No.: US 8,680,882 B2
(45) Date of Patent: Mar. 25, 2014

(54) 3D-IC INTERPOSER TESTING STRUCTURE AND METHOD OF TESTING THE STRUCTURE

(75) Inventors: Nan-Hsin Tseng, Tainan (TW); Chi-Yeh Yu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 316 days.

(21) Appl. No.: 13/285,114

(22) Filed: Oct. 31, 2011

(65) Prior Publication Data

US 2013/0106459 A1 May 2, 2013

(51) Int. Cl.
*G01R 31/00* (2006.01)

(52) U.S. Cl.
USPC .............................. 324/759.01; 324/762.03

(58) Field of Classification Search
USPC .................................................. 324/759.01
See application file for complete search history.

(56) References Cited

U.S. PATENT DOCUMENTS

| | | | |
|---|---|---|---|
| 5,505,320 A | 4/1996 | Burns et al. | |
| 6,297,541 B1 | 10/2001 | Ema et al. | |
| 6,664,174 B2 | 12/2003 | Ema et al. | |
| 7,193,314 B2 * | 3/2007 | Lin et al. | 257/700 |
| 7,998,853 B1 | 8/2011 | Rahman | |
| 2010/0013512 A1 | 1/2010 | Hargan et al. | |
| 2010/0038117 A1 * | 2/2010 | Chung et al. | 174/254 |
| 2011/0080184 A1 | 4/2011 | Wu et al. | |
| 2011/0102011 A1 | 5/2011 | Van der Plas et al. | |

* cited by examiner

*Primary Examiner* — Jermele M Hollington
*Assistant Examiner* — Raul Rios Russo
(74) *Attorney, Agent, or Firm* — Duane Morris LLP

(57) ABSTRACT

An interposer for a 3D-IC is provided with a plurality of functional metal wiring segments where the plurality of functional metal wiring segments are connected in series by a plurality of dummy metal wiring segments thus allowing the plurality of functional metal wiring segments to be electrically tested for continuity Each of the plurality of dummy metal wiring segments is provided with a laser fuse portion for disconnecting the dummy metal wiring segments upon completion of the electrical test.

13 Claims, 7 Drawing Sheets

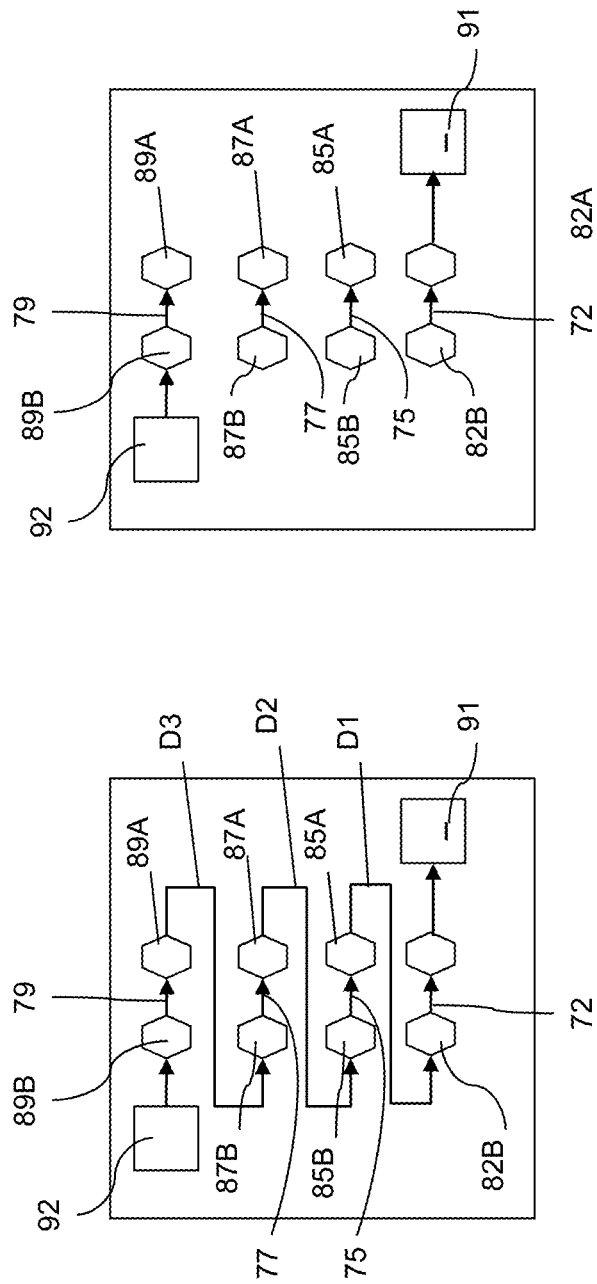

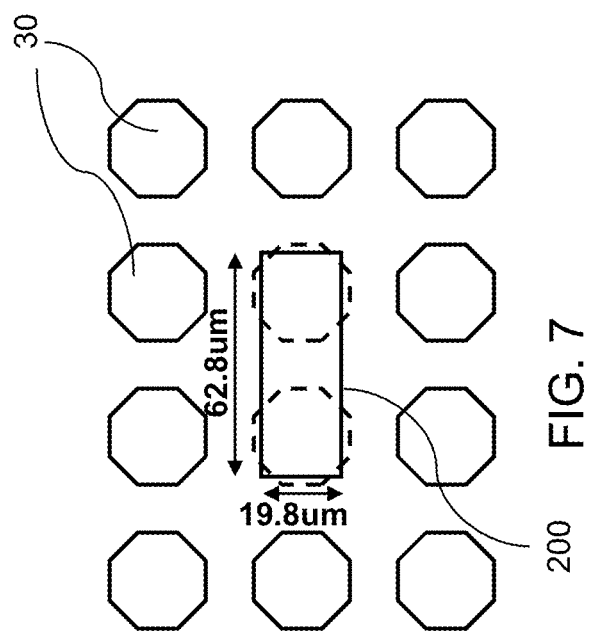

US 8,680,882 B2

3D-IC INTERPOSER TESTING STRUCTURE AND METHOD OF TESTING THE STRUCTURE

FIELD

The disclosed subject matter generally relates to three-dimensional integrated circuits ("3D-IC") interposer testing.

BACKGROUND

3D-IC is one of the popular IC chip packaging assembly technologies having high density of circuit elements. One of the consequences of having a large number of circuits and interconnections in the package is the demand for ever increasing number of test channels in electrical testers. Thus, there is a need for a packaging design that will reduce the required number of test channels for testing 3D-IC packages during a 3D-IC device assembly.

BRIEF DESCRIPTION OF THE DRAWINGS

FIG. 3 is a schematic illustration of the chain formed by the functional metal wiring segments of FIG. 2A connected in series by dummy metal wiring segments.

FIG. 4 is a schematic illustration of the functional metal wiring segments after the laser fuse portions of the dummy metal wiring segments are disconnected.

FIG. 7 shows a comparison of the dimensions of a laser fuse window relative to μBump pads.

DETAILED DESCRIPTION

Figure 1:
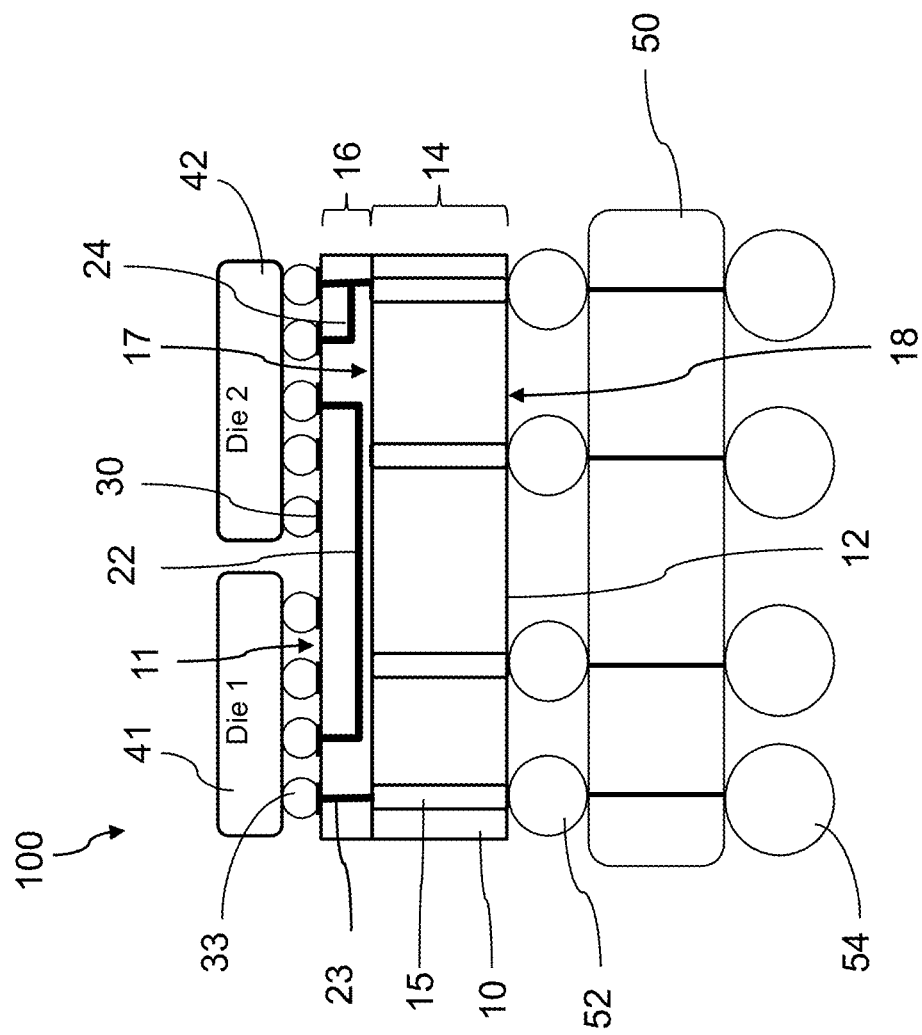
FIG. 1 shows an example of a 3D-IC assembly.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Referring to FIG. 1, an example of a 3D-IC assembly 100 is illustrated. In the 3D-IC assembly 100, an interposer 10 is provided having a front side 11 and a back side 12. The side of the interposer 10 to which IC dies, such as the laterally stacked IC dies 41 and 42, are joined, is referred to as the front side 11. The side opposite from the front side 11 that gets attached to a carrier substrate 50 by C4 bumps 52 is referred to as the back side 12. The carrier substrate 50, in turn, can be joined to the next level packaging structure by an array of ball-grid-array solder balls 54. In the 3D-IC assembly 100 shown, the IC dies 41 and 42 are laterally stacked. But, the inventive structures and methods described herein are equally applicable to 3D-IC packages in which the IC dies are vertically stacked on an interposer.

The interposer 10 comprises a substrate portion 14 and front-side interconnect wiring layers 16. The substrate portion 14 has a front surface 17 and a back surface 18 and is provided with a plurality of TSVs 15 that extend through its thickness. The front-side interconnect wiring layers 16 comprises multiple layers of metal wiring features including a redistribution wiring layer and is generally formed with layers of photoresist and lithographically patterned thin film metal wiring features, e.g. 22, 23, 24. The top surface of the front-side interconnect wiring layers 16, which is also the front side 11 of the interposer 10, is provided with an array of μBump pads 30 for receiving the μBumps 33 that join the IC dies 41, 42 to the interposer 10.

The thin film metal wiring features of the front-side interconnect wiring layers 16 can include inter-die connections 22, feed-through connections 23, and fan-out connections 24. The inter-die connections 22 are metal wiring lines that provides electrical connection between two μBump pads. The feed-through connections 23 traverse vertically through the front-side interconnect wiring layers 16 and are metal wiring lines that provides electrical connection between one μBump pad to a TSV. The fan-out connections 24 connects one μBump pad to a feed-through connection 23. The interposer also includes TSVs 15 below the front-side interconnect wiring layers 16.

Figure 2A:
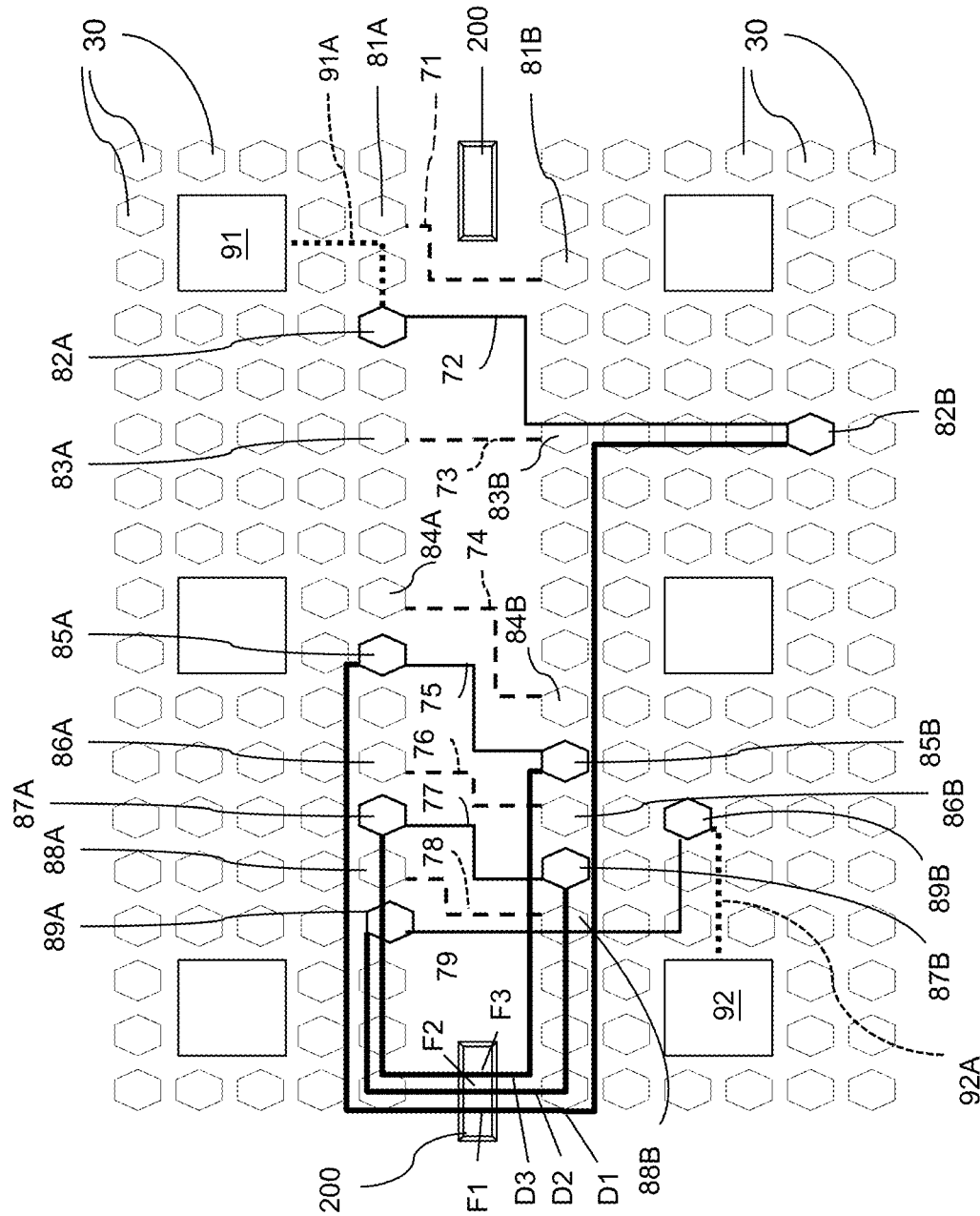
FIG. 2A shows an embodiment of a 3D-IC interposer according to the present disclosure.

According to an embodiment shown in FIG. 2A, a configuration for the front-side interconnect wiring layers 16 that will allow complete or substantially complete electrical continuity testing of the wiring features in the front-side interconnect wiring layers 16 will be described. The configuration for the front-side interconnect wiring layers 16 of an interposer includes a plurality of functional metal wiring segments, such as, for example, the illustrated segments 72, 73, 74, 75, 76, 77, 78 and 79. The configuration for the front-side interconnect wiring layers 16 further includes an array of μBump pads 30 provided on the top surface 11 of the front-side interconnect wiring layers 16. As illustrated, each of the functional metal wiring segments 72, 73, 74, 75, 76, 77, 78 and 79 connects two μBump pads. For example, the functional metal wiring segment 72 connects the pair of μBump pads 82A and 82B; the functional metal wiring segment 73 connects the pair of μBump pads 83A and 83B; the functional metal wiring segment 74 connects the pair of μBump pads 84A and 84B; the functional metal wiring segment 75 connects the pair of μBump pads 85A and 85B; the functional metal wiring segment 76 connects the pair of μBump pads 86A and 86B; the functional metal wiring segment 77 connects the pair of μBump pads 87A and 87B; the functional metal wiring segment 78 connects the pair of μBump pads 88A and 88B; and the functional metal wiring segment 79 connects the pair of μBump pads 89A and 89B. The functional metal wiring segments 72, 73, 74, 75, 76, 77, 78 and 79 shown are examples and the front-side interconnect wiring layers 16 can include any number of such functional metal wiring segments.

According to an embodiment, two or more of the plurality of functional metal wiring segments are connected in series by a plurality of dummy metal wiring segments. In the illustrated example of FIG. 2A, the functional metal wiring segments 72, 75, 77 and 79 are connected in series by a plurality of dummy metal wiring segments D1, D2 and D3, thus forming a chain consisting of the two or more functional metal wiring segments connected by the dummy metal wiring segments. Thus, the chain of the functional metal wiring segments 72, 75, 77 and 79 terminate in two terminal-end μBump pads 82A and 89B. With the functional metal wiring segments connected into a chain, by conducting an electrical continuity test on the chain, one can determine whether one or more of the functional metal wiring segments 72, 75, 77 and 79 is defective without testing each individual functional metal wiring segments. If the chain is defective, the interposer is defective so can be discarded. It is not necessary to test each individual functional metal wiring segments to determine which particular wiring segment is defective. That may be necessary for failure analysis purposes in order to determine the cause of the defect but for the purpose of manufacturing and assembly line quality control testing, it is only necessary that the electrical testing identify the defective interposer.

According to an embodiment, the chain of the functional metal wiring segments 72, 75, 77 and 79 can terminate in at least two terminal-end μBump pads such as 82A and 89B. In other words, each terminal end of the chain formed by a series of the functional metal wiring segments can have two or more terminal-end μBump pads if necessary to support some testing needs.

A 3D-IC interposer would typically have many functional metal wiring segments and one would expect that more than one chain of functional metal wiring segments would be electrically tested in order to verify that all or substantially all of the functional metal wiring segments are good.

In order to test the electrical continuity of the chain, electrical tester's probes are used to contact the two terminal ends of the chain. However, because the μBump pads are small, only about 20 μm in diameter, it is challenging to contact the μBump pads directly using electrical test probes (not shown). If the probes cannot make good contact with the μBump pads, reliable electrical testing is not feasible. In order to facilitate the electrical test probes, each of the terminal-end μBump pads 82A and 89B is connected to a sacrificial probe pad 91 and 92 by connection wirings 91A and 92A, respectively. The sacrificial probe pads substantially larger than the μBump pads in order to ensure good contact between the sacrificial probe pads and the electrical test probes. The μBump pads are typically 20 μm in diameter. The sacrificial probe pads on the other hand are typically at least 50 μm×50 μm. According to one embodiment, the surface area of the sacrificial probe pads are at least 100% larger than that of the μBump pads. Therefore, one can test the electrical continuity of the chain formed by the functional metal wiring segments 72, 75, 77 and 79 by probing the two sacrificial probe pads 91, 92.

The dummy metal wiring segments D1, D2 and D3 are formed in the front-side interconnect wiring layers 16 at one or more wiring levels within the front-side interconnect wiring layers 16 that are appropriate for the particular routing requirements.

FIG. 3 shows a schematic illustration of the chain formed by the functional metal wiring segments 72, 75, 77 and 79. The functional metal wiring segments are connected in series by the dummy metal wiring segments D1, D2 and D3. The two ends of the chain, thus formed, terminate with the sacrificial test probe pads 91 and 92.

Upon completion of the electrical testing of the interposer 10, the dummy metal wiring segments D1, D2 and D3 are no longer necessary and they are not wanted since for proper operation of the interposer 10 upon final assembly into the 3D-IC package, the functional metal wiring segments 72, 75, 77 and 79 cannot be connected in series. Thus, according to an embodiment of the present disclosure, each of the plurality of dummy metal wiring segments in the series is provided with a laser fuse portion for disconnecting the dummy metal wiring segment. A laser fuse portion is a portion of the dummy metal wiring segment that is configured to be disconnected by irradiating with a laser beam. In the illustrated example, the dummy metal wiring segments D1, D2 and D3 are provided with respective laser fuse portions F1, F2 and F3. Irradiating the laser fuse portions F1, F2 and F3 will cause the laser fuse portions to disconnect so that the functional metal wiring segments 72, 75, 77 and 79 are no longer electrically connected. According to another embodiment, the dummy metal wiring segments D1, D2 and D3 are patterned so that the fuse portions F1, F2 and F3 are located in close proximity in a region defined herein as a laser fuse window 200. All fuse portions F1, F2 and F3 in the laser fuse window 200 can be disconnected with one pass of high intensity laser beam into the laser fuse window 200. This is generally referred to as laser ablation. The laser ablation can be accomplished by shooting a pulse of sufficiently wide stationary laser beam into the laser fuse window 200 or sweeping a narrower laser beam across the length of the laser fuse window 200. By routing the dummy metal wiring segments to have their laser fuse portions be in close proximity to one another to be able to disconnect them with a single pass of the laser beam, a group of dummy metal wiring segments for a given chain of serially connected functional metal wiring segments can be efficiently disconnected after completion of the electrical test.

FIG. 3 is a schematic illustration of the circuit formed by the functional metal wiring segments 72, 75, 77 and 79 that are serially connected into a chain by the dummy metal wiring segments D1, D2 and D3. Two sacrificial probe pads 91 and 92 are connected to the terminal-end μBump pads at the ends of the chain. FIG. 4 shows the broken chain after the dummy metal wiring segments D1, D2 and D3 are disconnected by the use of the laser fuse portions F1, F2 and F3.

Figure 2B:
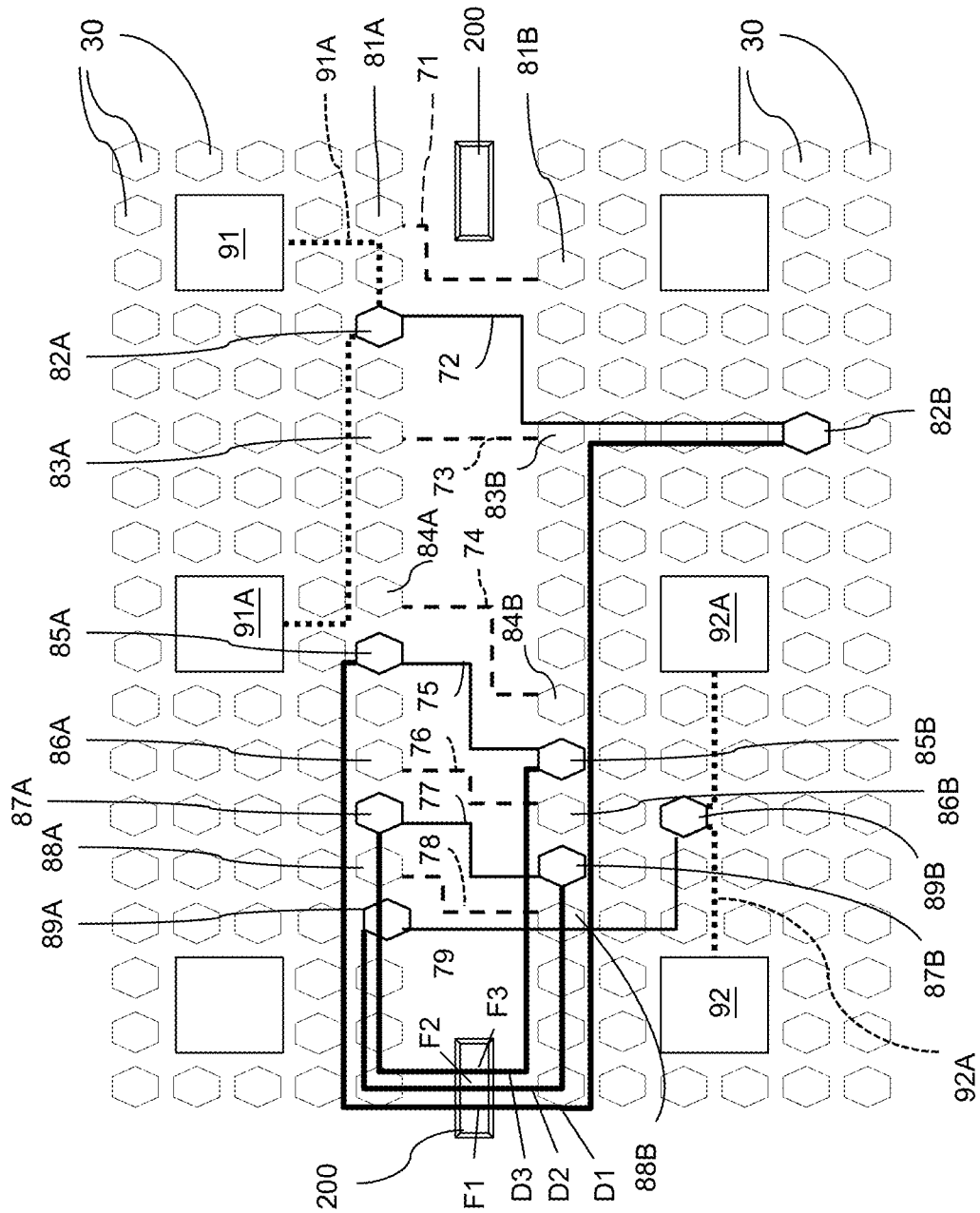
FIG. 2B shows another embodiment of a 3D-IC interposer according to the present disclosure.

In another embodiment, additional sacrificial pads can be connected to the terminal-end μBump pads for enhanced electrical test capability. For example, by providing two or more sacrificial probe pads connected to each of the terminal-end μBump pads, four-point probe resistivity measurement can be conducted on the chain. This is illustrated in FIG. 2B. In FIG. 2B, additional sacrificial probe pads 91A and 92A are provided and connected to the terminal-end μBump pads 82A and 89B, respectively. A four-point probe resistivity measurement can be made using the two pairs of sacrificial probe pads 91, 91A and 92, 92A.

Thus, according to an embodiment of the present disclosure, by connecting the plurality of functional metal wiring segments in the front-side interconnection wiring layers of a 3D-IC interposer into one or more chains of functional metal wiring segments, the functional metal wiring segments in each group being connected in series and terminating to a pair of sacrificial probe pads on the front-side interconnection wiring layers, the front-side wiring features can be electrically tested by probing only from the front-side of the interposer. Also, because the functional metal wiring segments are connected in series into a number of groups, fewer number of test channels are needed in the electrical testers. This maximizes the portion of the front-side wiring features in a front-side interconnection wiring layers 16 that can be tested for a given electrical tester by decreasing the demand for test channels which are often in limited supply because of the large number of circuits and interconnections that need to be tested during a 3D-IC device assembly.

Figure 6:
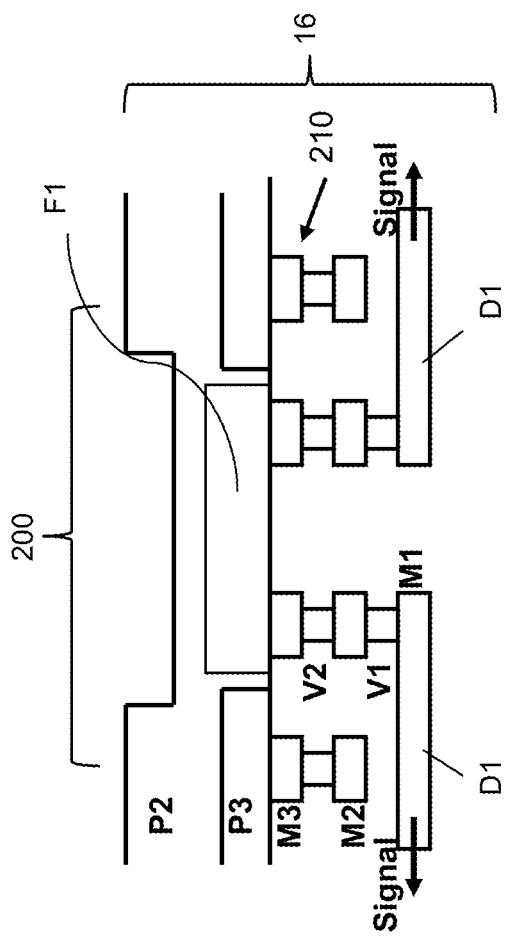
FIG. 6 shows a cross-sectional view of a laser fuse structure.
Figure 5:
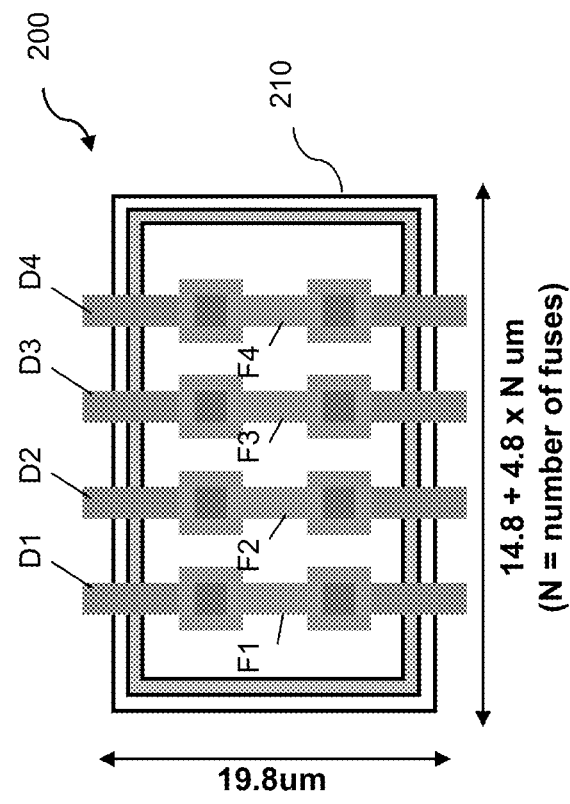
FIG. 5 shows a top-down view of a laser fuse window.

FIGS. 5-7 show the structure of the laser fuse portions in more detail. FIG. 5 shows an example of four laser fuse portions F1, F2, F3, F4 corresponding to dummy metal wiring segments D1, D2, D3 and D4 located in a laser fuse window 200. The laser fuse window 200 is defined by a guard ring structure 210. The guard ring structure 210 is a containment structure for containing any potential damage or cracks caused by the laser beam within the laser fuse window 200. FIG. 6 shows a cross-sectional view of the laser fuse window 200 portion of a front-side interconnection wiring layers 16. The cross-section is taken through the dummy metal wiring segment d1 and its laser fuse portion F1 shown as line A-A in FIG. 5. In this example, wiring layers (also known as metallization layers) M1, M2 and M3 are shown. The dummy metal wiring segment D1 is patterned in the wiring layer M1. The via structures V1, V2 connect the laser fuse F1 to the dummy metal wiring segment D1. The laser fuse portion F1 is formed on top of the wiring layer M3 and covered with the passivation layers P1 and P2. The portion of the passivation layer P2 within the laser fuse window 200 can be made to be thinner than the rest of the passivation layer P2 if necessary in order to facilitate the transmission of the laser beam down to the laser fuse portions F1, F2, F3, F4 for the laser ablation procedure. The guard ring structure 210 is formed in the wiring layers M1 and M2.

According to an embodiment, the laser fuse portions F1, F2, F3, F4 can be formed of aluminum metal or a suitable aluminum-copper alloy.

FIGS. 5 and 7 also show the relative dimensions of the laser fuse portions, compared to the μBump pads 30. As noted in FIG. 5, the typical laser fuse window 200 according to an embodiment is 19.8 μm by (14.8+4.8×N) μm, where N is the number of laser fuses. FIG. 7 shows that a laser fuse window 200' that can accommodate ten laser fuses having the dimension of 19.8 μm×62.8 μm can fit into an area as large as 2×1 μBump pads.

One of the benefits of the features described in the present disclosure is that the thorough electrical testing of the interposers allow improved ability to screen out defective interposers and allow only known good interposers to be used in 3D-IC assembly. This improves the overall yield of the final 3D-IC assembly because the chance of assembling known good dies to a defective interposer can be substantially reduced or eliminated.

According to an embodiment, an interposer for a 3D-IC is comprised of a substrate portion provided with a plurality of through substrate vias and a front surface and a back surface. The interposer has a front-side interconnection wiring layers formed on the front surface of the substrate portion. The front-side interconnection wiring layers comprises a plurality of functional metal wiring segments and an array of μBump pads are provided on the top surface of the front-side interconnection wiring layers. Each of the functional metal wiring segments connect two μBump pads. The interposer also has a plurality of dummy metal wiring segments connecting two or more of the plurality of functional metal wiring segments in series into a chain and the chain terminating in at least two terminal-end μBump pads. A sacrificial probe pad is connected to each of the two terminal-end μBump pads, wherein each of the plurality of dummy metal wiring segments in the chain is provided with a laser fuse portion for disconnecting the dummy metal wiring segment.

According to another embodiment, an interposer for a three-dimensional integrated circuit comprises a substrate portion provided with a plurality of through substrate vias and a front surface and a back surface. The interposer has a front-side interconnection wiring layers formed on the front surface of the substrate portion, where the front-side interconnection wiring layers comprise a plurality of functional metal wiring segments, and an array of μBump pads provided on the top surface of the front-side interconnection wiring layers. Each of the functional metal wiring segments connect two μBump pads. A plurality of dummy metal wiring segments connect two or more of the plurality of functional metal wiring segments in series into a chain and the chain terminates in at least two terminal-end μBump pads. The interposer also has two sacrificial probe pads connected to each of the two terminal-end μBump pads where each of the plurality of dummy metal wiring segments in the chain is provided with a laser fuse portion for disconnecting the dummy metal wiring segment.

Figure 8:
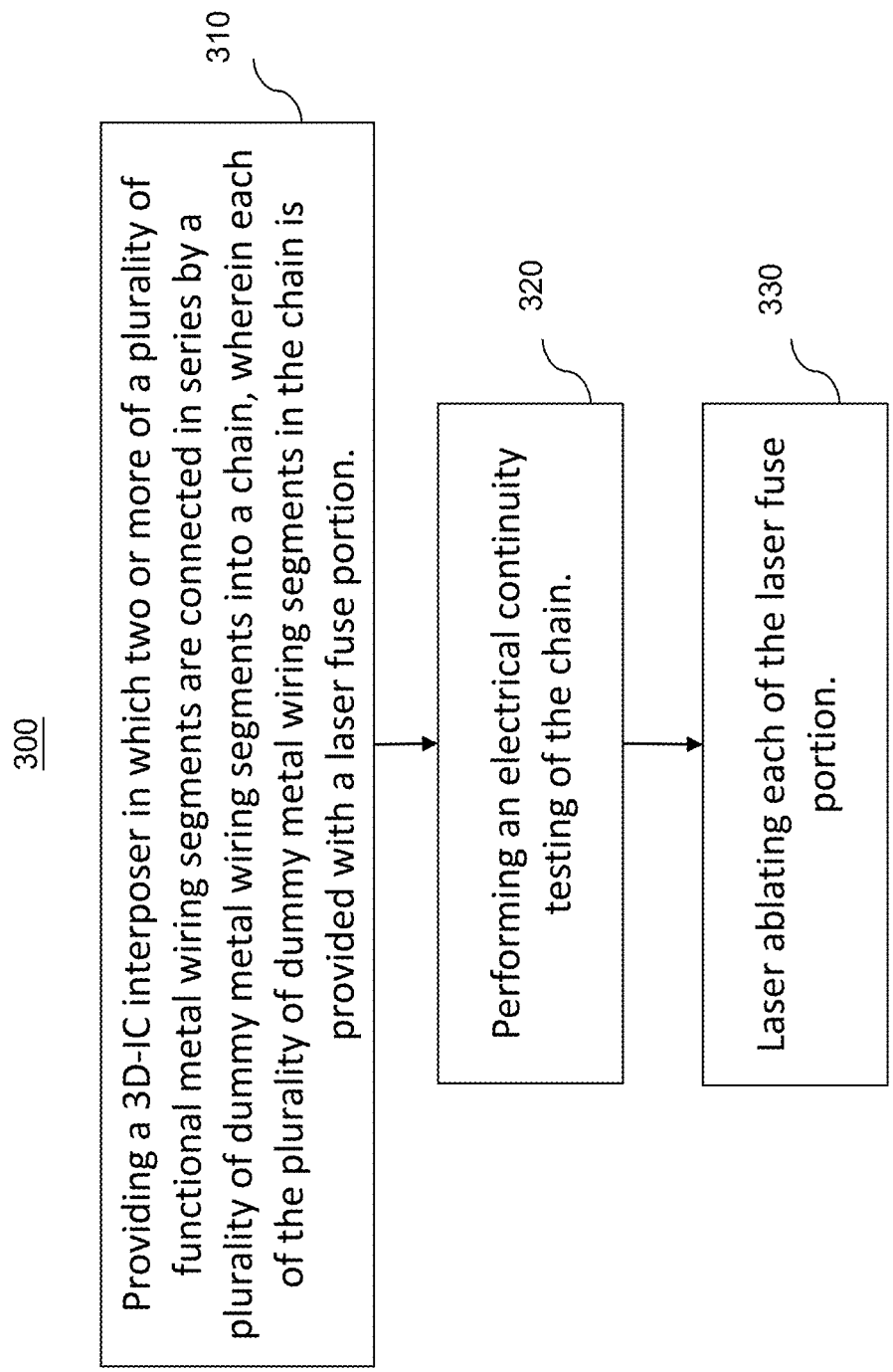
FIG. 8 is a flowchart of a method for a 3D-IC interposer according to an embodiment.

Referring to the flowchart 300 of FIG. 8, a method for testing a 3D-IC according to an embodiment of the present disclosure is described. The testing method includes providing a 3D-IC interposer in which two or more of a plurality of functional metal wiring segments are electrically connected in series by a plurality of dummy metal wiring segments into a chain, where each of the plurality of dummy metal wiring segments in the chain is provided with a laser fuse portion. (See box 310). Next, an electrical continuity testing of the chain is performed. (See box 320). After the electrical continuity testing of the chain is completed, each of the laser fuse portion is laser ablated, thus severing each of the dummy metal wiring segments and disconnecting the functional metal wiring segments in the chain. (See box 330).

The electrical continuity testing of the chain involves probing one or more of the at least one sacrificial probe pads 91, 91A, and 92, 92A at each end of the chain with electrical test probes (not shown). As discussed above, one can conduct a two-point electrical continuity testing by probing one sacrificial probe pad at each end of the chain. Alternatively, a four-point electrical continuity testing can be conducted by probing two sacrificial probe pads at each end of the chain using two pairs of probes. A first pair of probes are used for measuring current through the chain and the second pair of probes are used for measuring the voltage drop across the chain.

Although the subject matter has been described in terms of exemplary embodiments, it is not limited thereto. Rather, the appended claims should be construed broadly, to include other variants and embodiments, which may be made by those skilled in the art.

What is claimed is:

1. An interposer for a three-dimensional integrated circuit comprising:
   a substrate portion provided with a plurality of through substrate vias and having a front surface and a back surface;
   a front-side interconnection wiring layers formed on the front surface of the substrate portion, wherein the front-side interconnection wiring layers comprising:
      a plurality of functional metal wiring segments; and
      an array of μBump pads provided on the top surface of the front-side interconnection wiring layers, wherein each of the functional metal wiring segments connecting two μBump pads;
   a plurality of dummy metal wiring segments connecting two or more of the plurality of functional metal wiring segments in series into a chain and the chain terminating in at least two terminal-end μBump pads; and
   at least one sacrificial probe pad connected to each of the two terminal-end μBump pads;
   wherein each of the plurality of dummy metal wiring segments in the chain is provided with a laser fuse portion for disconnecting the dummy metal wiring segment.

2. The interposer according to claim 1, further wherein the laser fuse portions in a given chain are located within a fuse window.

3. The interposer according to claim 2, wherein the laser fuse portions are aligned parallel to one another and in a side-by-side arrangement for enabling a laser beam to ablate all of the laser fuse portions in the fuse window section in a single pass.

4. The interposer according to claim 1, wherein the dummy metal wiring segments are formed in the front-side interconnect wiring layers at one or more wiring levels within the front-side interconnect wiring layers.

5. The interposer according to claim 1, wherein the surface area of the sacrificial probe pads are larger than the μBump pads by at least 100%.

6. An interposer for a three-dimensional integrated circuit comprising:
- a substrate portion provided with a plurality of through substrate vias and having a front surface and a back surface;
- a front-side interconnection wiring layers formed on the front surface of the substrate portion, wherein the front-side interconnection wiring layers comprising:
  - a plurality of functional metal wiring segments; and
  - an array of μBump pads provided on the top surface of the front-side interconnection wiring layers, wherein each of the functional metal wiring segments connecting two μBump pads;
- a plurality of dummy metal wiring segments connecting two or more of the plurality of functional metal wiring segments in series into a chain and the chain terminating in at least two terminal-end μBump pads; and
- two sacrificial probe pads connected to each of the two terminal-end μBump pads;
- wherein each of the plurality of dummy metal wiring segments in the chain is provided with a laser fuse portion for disconnecting the dummy metal wiring segment.

7. The interposer according to claim 6, further wherein the laser fuse portions in a given chain are located within a fuse window.

8. The interposer according to claim 7, wherein the laser fuse portions are aligned parallel to one another and in a side-by-side arrangement for enabling a laser beam to ablate all of the laser fuse portions in the fuse window section in a single pass.

9. The interposer according to claim 6, wherein the dummy metal wiring segments are formed in the front-side interconnect wiring layers at one or more wiring levels within the front-side interconnect wiring layers.

10. The interposer according to claim 6, wherein the surface area of the sacrificial probe pads are larger than the μBump pads by at least 100%.

11. A method for electrical testing comprising:
- providing a 3D-IC interposer in which two or more of a plurality of functional metal wiring segments are connected in series by a plurality of dummy metal wiring segments into a chain, wherein each of the plurality of dummy metal wiring segments in the chain is provided with a laser fuse portion;
- performing an electrical continuity testing of the chain; and
- laser ablating each of the laser fuse portion.

12. The method according to claim 11, wherein the chain has two ends and at least one sacrificial probe pads are provided at each end of the chain and the step of performing an electrical continuity testing of the chain includes two-point electrical continuity testing of the chain by probing one of the at least one sacrificial probe pads at each end of the chain with electrical test probes.

13. The method according to claim 11, wherein the chain has two ends and two sacrificial probe pads are provided at each end of the chain and the step of performing an electrical continuity testing of the chain includes four-point electrical continuity testing of the chain by probing the two sacrificial probe pads at each end of the chain with electrical test probes.

* * * * *